United States Patent [19]
Jang et al.

[11] Patent Number: 6,051,115
[45] Date of Patent: *Apr. 18, 2000

[54] ADHESIVE STRENGTH INCREASING METHOD FOR METAL THIN FILM

[75] Inventors: Hong Kyu Jang; Seok Keun Koh; Hyung Jin Jung; Won Kook Choi, all of Seoul, Rep. of Korea

[73] Assignee: Korea Institute of Science and Technology, Seoul, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/893,153

[22] Filed: Jul. 15, 1997

[30]  Foreign Application Priority Data

Jul. 16, 1996 [KR] Rep. of Korea ...................... 96/28714

[51] Int. Cl.$^7$ .................................................. C23C 14/34

[52] U.S. Cl. ..................... 204/192.34; 427/531; 427/533

[58] Field of Search ................................... 427/528, 531, 427/532, 533; 204/192.34, 192.16, 192.11, 298.04

[56]  References Cited

U.S. PATENT DOCUMENTS

| | | |
|---|---|---|
| 3,895,602 | 7/1975 | Bobenrieth .......................... 204/298.04 |
| 4,793,792 | 12/1988 | Akino ........................................ 425/385 |
| 4,815,962 | 3/1989 | Cardone ...................................... 427/38 |
| 4,844,785 | 7/1989 | Kitabatake et al. ................ 204/192.11 |
| 4,849,082 | 7/1989 | Baty et al. .......................... 204/192.31 |
| 4,874,493 | 10/1989 | Pan ...................................... 204/192.11 |
| 5,055,318 | 10/1991 | Deutchman et al. ...................... 427/38 |
| 5,482,602 | 1/1996 | Cooper et al. ...................... 204/192.11 |
| 5,712,193 | 1/1998 | Hower et al. ............................ 437/187 |

Primary Examiner—Nam Nguyen
Assistant Examiner—Steven H. Ver Steeg
Attorney, Agent, or Firm—Pennie & Edmonds LLP

[57]  ABSTRACT

An adhesive strength increasing method which does not need a bulky apparatus such as an ion implantation apparatus and prevent the characteristic of a material from being degraded by using a high level current ion of a low level energy, thus increasing an adhesive strength between a metal thin film and a glass substrate. In the present invention, a metal is deposited on a substrate an inert gas or a reactive gas having a predetermined energy is irradiatd to the deposited metal thin film, and then the metal thin film is sealed, thus increasing an adhesive strength between a metal thin film and a glass substrate.

4 Claims, 5 Drawing Sheets

ADHESIVE STRENGTH INCREASING METHOD FOR METAL THIN FILM

BACKGROUND OF THE INVENTION

1. Field of the Invention

The present invention relates to an adhesive strength increasing method for a metal thin film, and in particular to an improved adhesive strength increasing method for a metal thin film which is capable of significantly enhancing an adhesive strength between a metal thin film and a substrate formed of silicon or glass.

2. Description of the Conventional Art

Recently, as the high-tech technology advances, a light-thin-compact product is desperately needed. In particular, in the optical and electronic industry field, the method for increasing an adhesive strength between a metal thin film and a glass substrate is considered as the most important method.

As the methods for increasing an adhesive strength between the metal thin film and the glass substrate, there are known a method for washing the glass substrate in an ultrasonic container by using acetone, methanol, ethanol, etc., rewashing the same by using distilled water, and dehydrating the same in an oven having a filter for more than one hour at about 200° C. for preventing dust from being introduced thereinto, and a method for washing and dehydrating in the same manner as in the previous method and depositing Cr, Ti, etc., which has a good adhesive strength with respect to the glass substrate, on the glass substrate and then depositing a metal on the resultant material.

However, the earlier method has a slightly increased adhesive strength but does not have a substantial adhesive strength under environment in which there are much friction and abrasion, and the later method has an advantage in that the adhesive strength is greatly increased but has a disadvantage in that since an additional metal such as Cr, Ti, etc., is used as a buffer layer, the metal of the buffer layer is spread out onto the metal layer formed on the buffer layer, thus forming a new phase, whereby the characteristic of the material may be degraded.

In addition, there is an ion beam mixing method which is directed to forcibly mixing at a boundary formed between a substrate and a thin film. Since the method needs a high ion energy, a bulky apparatus such as an ion implanter or a Van der Graaf accelerator is required, so that it is difficult to actually use the above-described method. In particular, it is impossible to increase an adhesive strength with respect to Au and glass material by using this method.

SUMMARY OF THE INVENTION

Accordingly, it is an object of the present invention to provide an adhesive strength increasing method for a metal thin film which overcomes the aforementioned problem encountered in the conventional art.

It is another object of the present invention to provide an improved adhesive strength increasing method for a metal thin film which is capable of increasing an adhesive strength of a metal thin film deposited on a glass substrate.

It is still another object of the present invention to provide an improved adhesive strength increasing method for a metal thin film which is capable of increasing an adhesive strength of a metal thin film and preventing the characteristic of a material from being changed.

It is still another object of the present invention to provide an improved adhesive strength increasing method for a metal thin film by which it is possible to implement an adhesive strength increasing effect for a metal thin film at a low cost.

To achieve the above objects, there is provided an adhesive strength increasing method for a metal thin film which includes the steps of depositing a metal on a substrate, and irradiating an inert gas or an ion of a reactive gas having a predetermined energy to the deposited metal thin film.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The glass used as a substrate in the present invention was a slide glass having a thickness of 0.2 mm and a 12 mm×12 mm regular square shape. The washing of the substrate was performed by using acetone, and then was rewashed by a distilled water, and washed again by using methanol. Thereafter, the substrate was submerged into ethanol and then was ultrasonic-washed and then was washing by using a distilled water, and was quickly dehydrated under 99.9% nitrogen environment.

Figure 1:
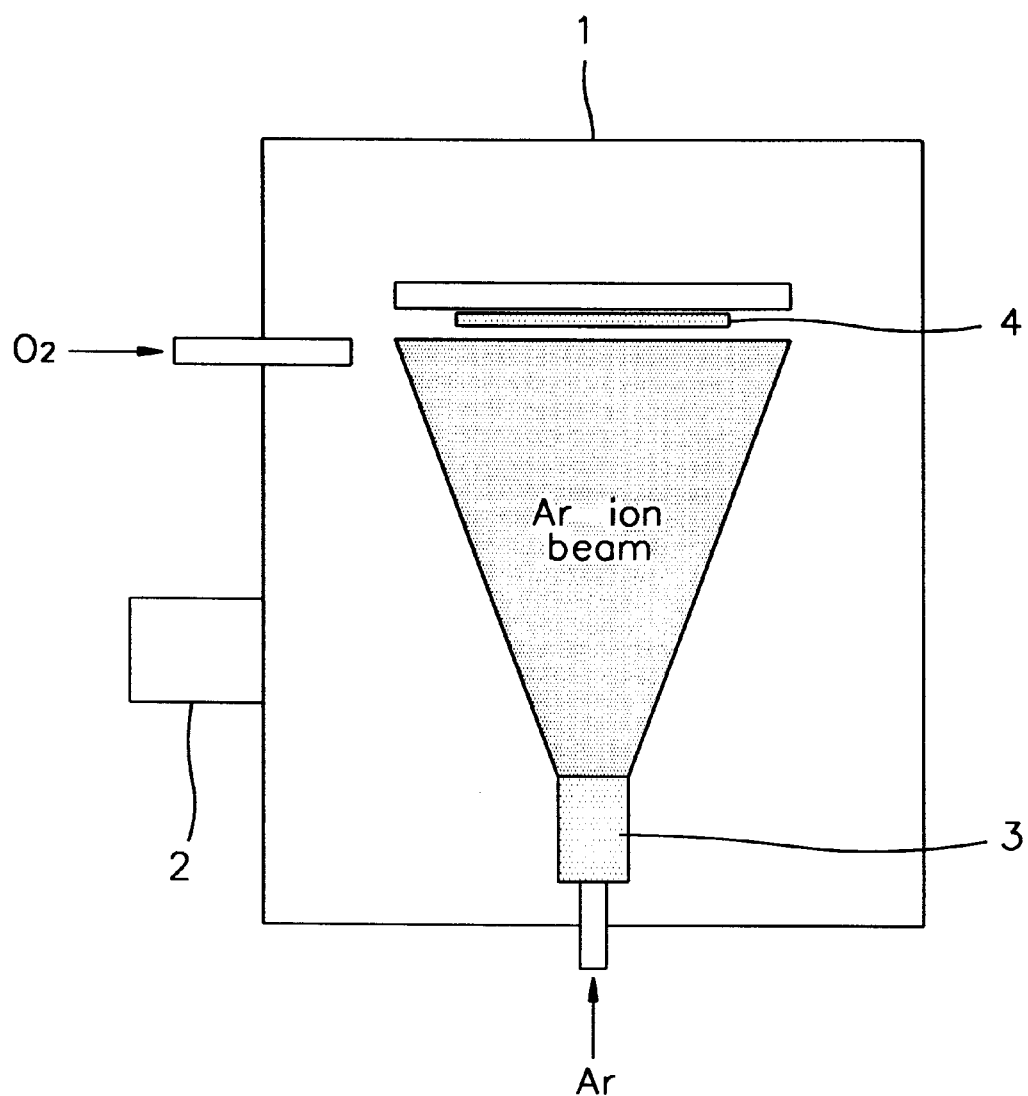
FIG. 1 is a view illustrating an $Ar^+$ ion beam irradiattion state of an adhesive strength increasing method for a metal thin film according to an example of the present invention.

As shown in FIG. 1, a vacuum container 1 includes an oil diffusion pump and an oil rotation pump each having an 8-inch diameter, and a liquid nitrogen trap is connected between the oil diffusion pump 2 and the vacuum container 1, thus preventing a sample material from being polluted by hydrocarbon.

At an initial stage, the vacuum level was $5\times10^{-7}\sim1\times10^{-6}$ Torr, and the vacuum level at the time of depositing an Au thin film and irradiating $Ar^+$ ions was $1\times10^{-6}\sim1\times10^{-5}$ Torr.

An Au thin film was deposited on a glass substrate 4 at a room temperature in a sputtering method by using a cold-hollow cathode type ion gun 3 having a diameter of 5 cm.

An 99.99% Au circular plate having a diameter of 4 inches was used as a sputter target (metal), and, under the condition of a deposition of an Au thin film, 1 keV $Ar^+$ ion was used, and the Au thin film was deposited to a thickness of 1600Å at a deposition rate of 0.4Å/sec (after the deposition, the thickness thereof was 1590Å measured by the RBS).

1 keV $Ar^+$ ion was irradiated to the deposited Au thin film by using the ion gun 3 at a room temperature by the amount of ions from $1\times10^{16}$ $Ar^+$ $cm^{-2}$ to $2\times10^{17}$ $Ar^+$ $cm^{-2}$. The current density of $Ar^+$ ion measured by Faraday cup was 15 $\mu Acm^{-2}$ at a portion around the sample material.

The Rutherford Backscattering Spectroscopy (RBS) was measured in order to check the thickness variation of an Au thin film based on the irradiation amount of $Ar^+$ ions and the atom movement of the Au thin film and the glass substrate. In order to obtain an RBS spectrum, 2 MeV $He^-$ ion was used as an incident ion, and $He^+$ ions which were scattered backwardly from the sample material were detected by a detector having an energy resolution capability of 14 keV at an angle of 170° with respect to the incident direction.

Finally, the thickness of the Au thin film and the state of the boundary were checked by using an RBS spectrum analysis RUMP code based on the RBS spectrum measured in the above-described manner.

Figure 2A:
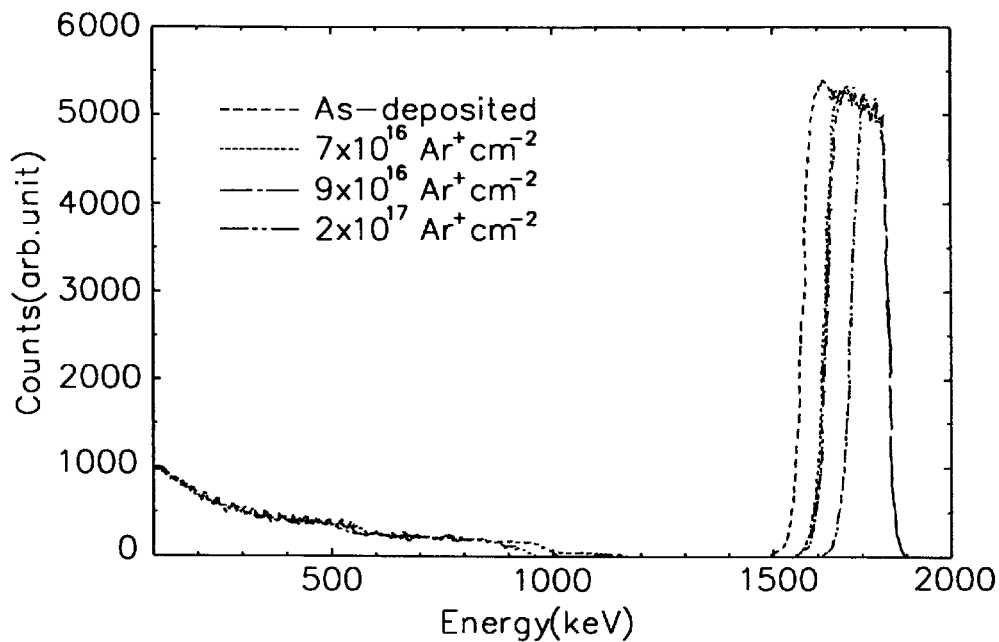
FIGS. 2A and 2B are diagrams illustrating RBS (Rutherford Backscattering Spectroscopy) spectrums from an Au/Glass sample material to which an $Ar^+$ ion is irradiated.
Figure 2B:
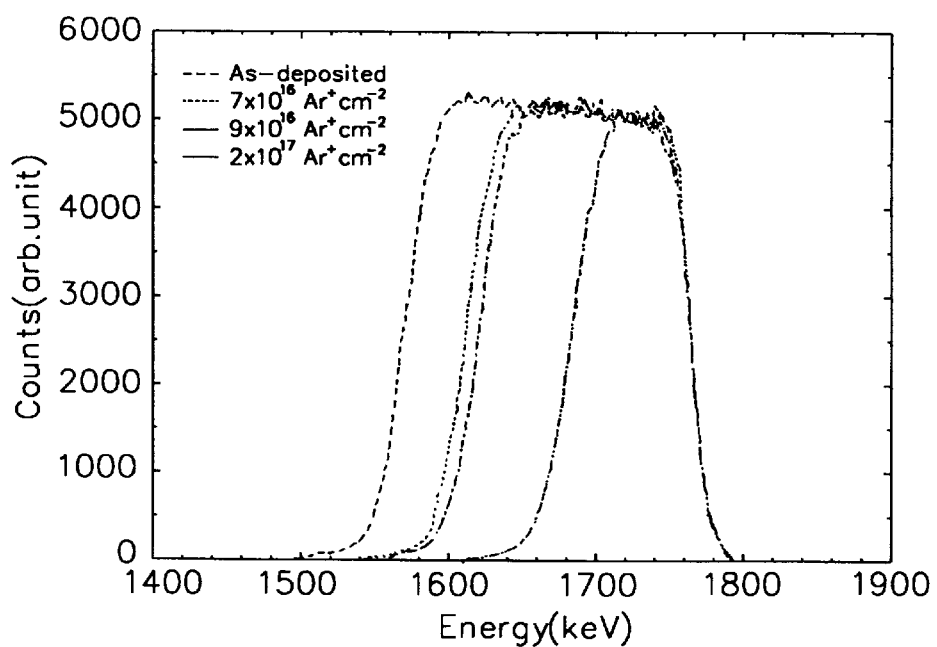

FIG. 2A illustrates an RBS spectrum of an Au thin film from a sample material irradiated by $Ar^+$ ions. As shown therein, the thickness of Au thin film becomes thinner as the irradiation amount of ions was increased. Namely, as the irradiation amount of ion was increased, the Au thin film was sputtered, whereby the thickness of the Au thin film become thinner. The sputtering yield of Au atom at the time of irradiating 1 keV $Ar^+$ ion obtained based on the RBS spectrum was decreased as the irradiation amount of ions was increased as shown in Table 1.

TABLE 1

The variation of a thickness of a thin film and a sputtering yield based in the irradiation amount of 1keV $Ar^+$ ions

|  | un-irradiated | $7 \times 10^{16}$ $cm^{-2}$ | $9 \times 10^{16}$ $cm^{-2}$ | $2 \times 10^{17}$ $cm^{-2}$ |
|---|---|---|---|---|
| Thickness | 159 Å | 1210 Å | 1157 Å | 711 Å |
| Yield | — | 3.19 | 2.84 | 2.59 |

Since a lower energy side signal of the Au thin film and a silicon surface side signal of the glass substrate did not vary with respect to the variation of the irradiation amount of ions, there were not atom movements in the boundary between the Au thin film and the glass substrate. As known in a computer simulation experiment using a TRIM (Transport ions in matters) 95 code, since the mean projects range $R_p$ and the straggling range $\Delta R_p$ by which 1 keV $Ar^+$ ion penetrated were small as values of 17Å and 9Å, there were not atom movements between the Au thin film and the glass substrate.

Figure 3:
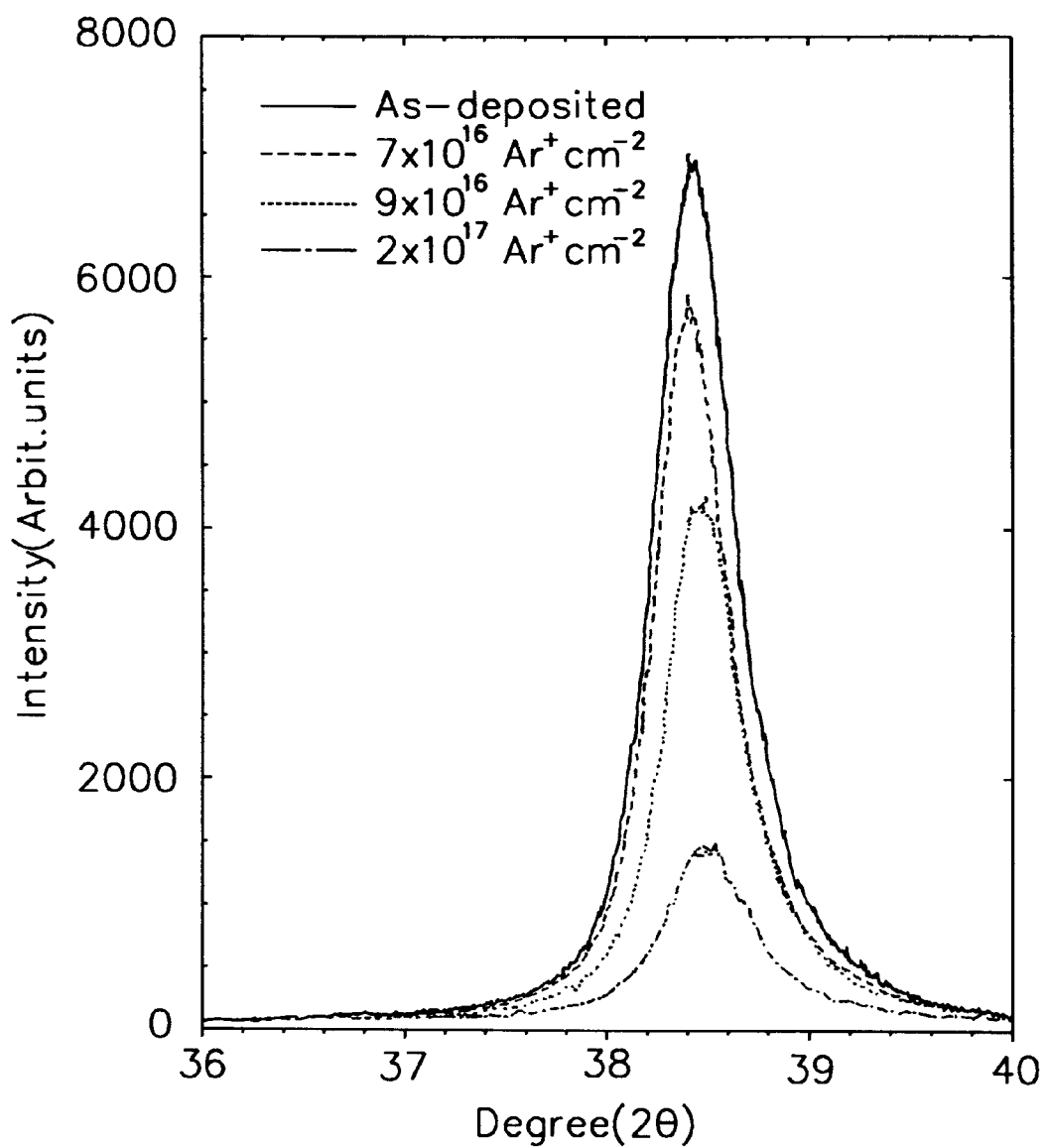
FIG. 3 is an X-ray diffraction signal diagram illustrating a crystal characteristic of a thin film based on the amount of $Ar^+$ ion beams according to the present invention.

FIG. 3 illustrates a crystal characteristic of a thin film based on the irradiation amount of $Ar^+$ ions and an X-ray diffraction(XRD) signal.

The experiment was conducted in order to obtain a desired XRD signal in a range of $2\theta=20°\sim80°$.

As shown in FIG. 3, irrespective of the irradiation of $Ar^+$ of ions, a textured structure having a direction of <111> as the priority direction was formed. As the irradiation amount of $Ar^+$ ions was increased, the size of the signal corresponding to the Au thin film become small. The surface of the Au thin film become non-amorphous by the $Ar^+$ irradiation, the irradiation amount of ions was increased, and the Au thin film was sputtered, so that the thickness of the Au thin film was made thinner, the size of the signal becomes small. As the irradiation amount of $Ar^+$ ions with respect to the Au thin film was increased, there was not a positional movement of a (111) surface because the fine structure of the thin film was not varied due to the ion irradiation. Namely, the crystal characteristic of the thin film was not affected by the $Ar^+$ irradiation.

Figure 4:
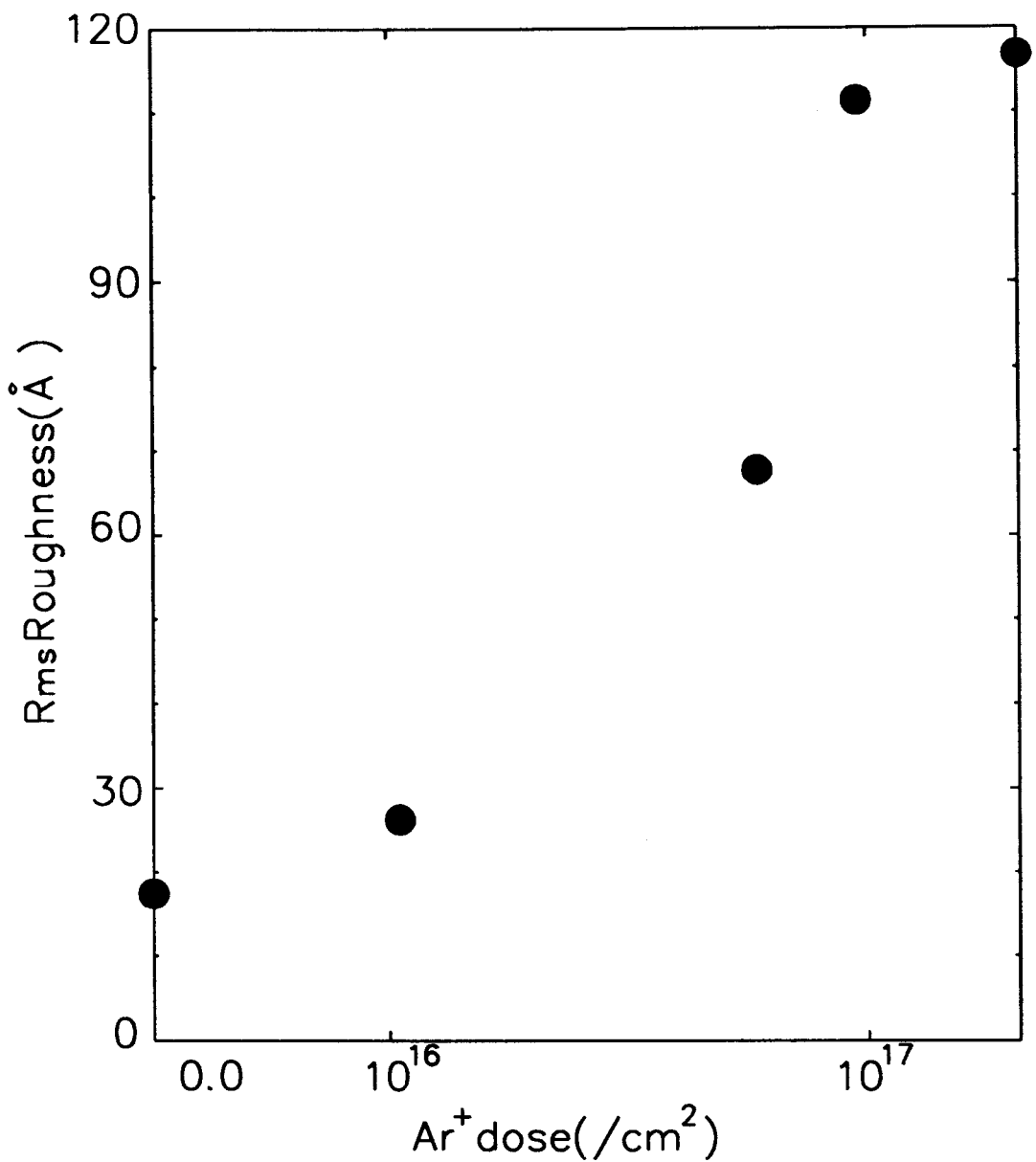
FIG. 4 is a graph illustrating the amount of ion beams based on the roughness of a root mean square($R_{ms}$) computed based on a three-dimensional image of an Au thin film to which an $Ar^-$ ion beam is irradiated according to the present invention.

FIG. 4 illustrates a dependency by the irradiation amount of ions of a root mean square roughness $R_{ms}$ computed by a three-dimensional image of an Au thin film surface to which the $Ar^+$ ions were irradiated by using Atomic Field Microscopy(AFM) which was available in the atmosphere. The irradiation amount of $Ar^+$ ions was increased, $R_{ms}$ was increased. Namely, as the irradiation amount of ions was increased, the surface roughness of $R_{ms}$ was increased. Generally, when the surface of the material was sputtered by ions irradiated thereonto, the structure of the sputtered surface was made to a conical shape. The roughness of the surface was increased because the depth of the conical portion was made deeper as the irradiation amount of ions was increased.

Figure 5:
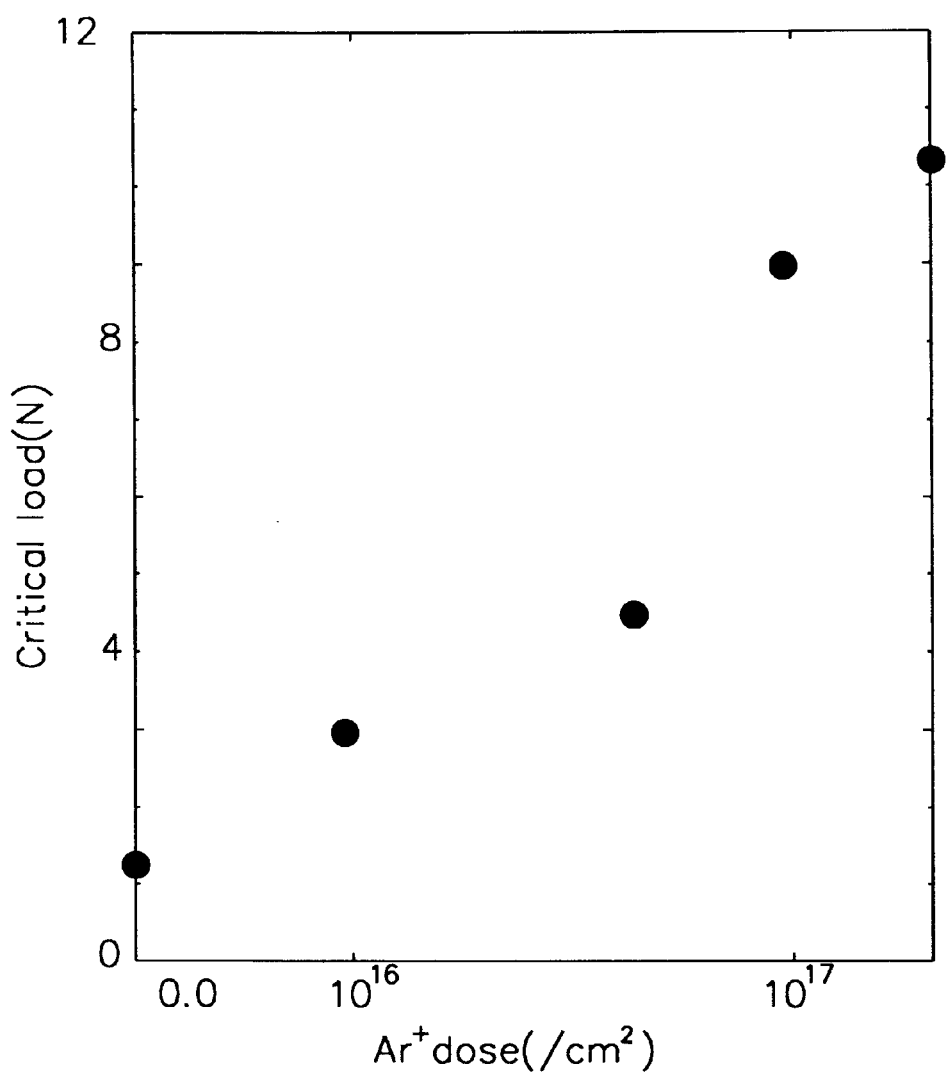
FIG. 5 is a graph illustrating a variation of a relative adhesive strength of a thin film based on the irradiation amount of ion beams according to the present invention.

In addition, In order to check the variation of a relative adhesive strength based on the irradiating of $Ar^+$ with respect to the Au thin film, the scratch test was performed by using a diamond tip having a diameter of 250 $\mu m$. FIG. 5 was a graph illustrating a variation of a relative adhesive strength of a thin film based on the irradiation amount of ions. As shown therein, the relative adhesive strength of the sample material to which no ion was irradiated was 1.1N, and the relative adhesive strength of the sample material to which ions were irradiated by the amount of $2\times10^{17}$ $Ar^+/cm^2$ was 10N, which was 9 times the adhesive strength of the material to which ions were not irradiated.

The adhesive strength was greatly increased because the $Ar^+$ ions collide with the Au thin film and lose its energy. This energy was consumed due to the grate vibration, an ionization and a recoil of the target atom. Namely, an Au atom receives a dynamic energy of $Ar^+$ ion and exists in a high density state in which no void was provided.

As described above, the adhesive strength increasing method for a metal thin film according to the present invention is directed to depositing Au atoms on a glass substrate in a sputtering method and processing the surface thereof by 1 keV $Ar^+$ ions, so that it is possible to obtain an Au tin film in which the crystal characteristic thereof is formed in the direction of a (111) surface irrespective of the ion irradiation. As the irradiation amount of ions is increased, the size of the x-ray signal is decreased, and the thickness of the Au tin film is gradually decreased due to the sputtering effect as the irradiation amount of ions is increased. The yield of the sputtering is decreased as the irradiation amount of ions is increased as shown in Table 1.

In addition, the roughness of the surface of the Au thin film is increased as the irradiation amount of $Ar^+$ ions is increased to a thickness of 117Å at $2\times10^{17}$ $Ar^+/cm^2$. As the irradiation amount of $Ar^+$ ions is increased, the adhesive strength is increased from 1.1N to 10N, 9 times.

Therefore, in the adhesive strength increasing method for a metal thin film according to the present invention, it is possible to fabricate an Au thin film having a good adhesive strength with respect to a glass substrate by irradiating 1 keV $Ar^+$ ions which have low level energy, so that the characteristic of the material is not changed, and it is possible to increase an adhesive strength at low cost.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A method for increasing an adhesive strength of a metal film, comprising the steps of:

washing a substrate;

dehydrating the substrate;

depositing a metal film having an adhesive strength directly upon the substrate; and irradiating energized ions of a gas selected from the group consisting of $N_2$, $O_2$, and air with an ion gun and directing those ions onto a surface of the deposited metal film to sputter the metal film and increase the adhesive strength of the metal film.

2. The method of claim 1, wherein the energized ions have an energy of 0.5~30 keV.

3. The method of claim 2, wherein the amount of energized ions applied to the film is between $1\times10^{15}$ to $1\times10^{19}$ ions/cm$^2$.

4. The method of claim 1 wherein the energized ions of gas are positively charged ions.

* * * * *